United States Patent
Liu et al.

(10) Patent No.: US 7,088,118 B2
(45) Date of Patent: Aug. 8, 2006

(54) MODULARIZED PROBE CARD FOR HIGH FREQUENCY PROBING

(75) Inventors: An-Hong Liu, Tainan (TW); Yeong-Her Wang, Tainan (TW); Yeong-Ching Chao, Taichung (TW); Yao-Jung Lee, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/011,200

(22) Filed: Dec. 15, 2004

(65) Prior Publication Data

US 2006/0125498 A1 Jun. 15, 2006

(51) Int. Cl.
*G01R 31/02* (2006.01)

(52) U.S. Cl. .................. 324/754; 324/761
(58) Field of Classification Search ............. None
See application file for complete search history.

(56) References Cited

U.S. PATENT DOCUMENTS

| | | | | |
|---|---|---|---|---|
| 5,148,103 A | * | 9/1992 | Pasiecznik, Jr. | 324/758 |
| 5,491,426 A | | 2/1996 | Small | 324/754 |
| 5,806,181 A | * | 9/1998 | Khandros et al. | 29/874 |
| 5,828,226 A | * | 10/1998 | Higgins et al. | 324/762 |
| 5,872,459 A | * | 2/1999 | Pasiecznik, Jr. | 324/765 |
| 5,929,646 A | * | 7/1999 | Patel et al. | 324/754 |
| 6,501,343 B1 | * | 12/2002 | Miller | 333/33 |
| 6,856,150 B1 | * | 2/2005 | Sporck et al. | 324/754 |
| 6,897,666 B1 | * | 5/2005 | Swettlen et al. | 324/754 |
| 2003/0099097 A1 | * | 5/2003 | Mok et al. | 361/767 |
| 2004/0223309 A1 | * | 11/2004 | Haemer et al. | 361/767 |
| 2005/0237073 A1 | * | 10/2005 | Miller et al. | 324/754 |

* cited by examiner

*Primary Examiner*—Vinh Nguyen
*Assistant Examiner*—Richard Isla-Rodas
(74) *Attorney, Agent, or Firm*—Troxell Law Office, PLLC

(57) ABSTRACT

A modularized probe head for high frequency probing is provided. The probe head mainly includes a probe head, a mounting board and an interposer between the probe head and the mounting board. The probe head has a plurality of cavities on its back surface. A plurality of decoupling components are installed inside the cavities and are electrically coupled to the ground/power circuitry of the probe head via by-pass circuitry. The interposer has a bottom surface corresponding to the back surface of the probe head, and includes a plurality of contact ends on the bottom surface. Some of the contact ends electrically contact the decoupling components and electrically coupled to the ground plane of the mounting board.

2 Claims, 3 Drawing Sheets

MODULARIZED PROBE CARD FOR HIGH FREQUENCY PROBING

FIELD OF THE INVENTION

The present invention relates to a probe card configured for probing a semiconductor wafer under test, and more particularly to a probe card for high frequency probing.

BACKGROUND OF THE INVENTION

The development of semiconductor devices is always walking toward higher density and higher frequency. Conventionally, a probe card is mounted on the test head of a tester for chip probing semiconductor devices in wafer form. In order to save the testing cost and to increase the testing throughput, multiple DUT (device under test) probing is required and developed. For multiple DUT probing, the circuit design of a probe card becomes more complicated than ever. Moreover, the EMI (Electro-Magnetic Interference) will become a dominant factor in high frequency probing. Without accurate EMI control in a probe card, the testing results may be misleading and causing yields loss.

A probe card assembly had been disclosed in the U.S. Pat. No. 5,491,426. A plurality of probe needles are installed on the lower surface of a probe card. A decoupling apparatus is installed in a cavity of a load board on the upper surface of the probe card to eliminate signal noises causing by electromagnetic waves. Nevertheless, the decoupling apparatus can filter out only the signal noise generated by the cables connecting between a tester and a probe card, but not the signal noise generated by the probe card itself. The decoupling apparatus does not function effectively in this case and only can fit for the conventional cantilever probe cards.

SUMMARY OF THE INVENTION

A main purpose of the present invention is to provide a modularized probe card for high frequency probing. It mainly includes a probe head, a mounting board and an interposer. There are a plurality of cavities on the back surface of the probe head for deposing a plurality of decoupling components which are connecting to the power plane and the ground plane of the probe head. The power plane and the ground plane of the probe head are respectively connected to the power plane and the ground plane of the mounting board through a plurality of power and ground circuitry inside the probe head, then through a plurality of contact pads on the back surface of the probe head which are connected to the contact ends on the bottom surface of the interposer, then through a plurality of power and ground circuitry in the interposer, then through the contact ends on the top surface of the interposer which connected to the contact pads on the bottom surface of the mounting board, then through the power/ground circuitry of the mounting board to the power plane and ground plane in the mounting board. Therefore, with the lowest manufacturing cost, a plurality of decoupling components are deposed close to a plurality of probes on the probing surface of the probe head to filter out the internal signal noise caused by the complicated circuitry inside a probe card. There is no need for fabricating embedded decoupling components inside the probe head so that the cost of the probe head made by a ceramic substrate will not increase.

The modularized probe head according to the present invention mainly comprises a probe head, a plurality of decoupling components, a mounting board, and an interposer. The probe head has a probing surface, a back surface and a plurality of cavities on the back surface. A plurality of probes are formed on the probing surface of the probe head. A plurality of decoupling components are deposed in the cavities and are electrically connected to the corresponding probes. The mounting board is configured for mounting onto the test head of a tester. The interposer is installed between the probe head and the mounting board as an electrical connection medium. The interposer includes a plurality of the first contact ends for electrically connecting to the back surface of the probe head, further electrically contacting the decoupling components. The interposer further includes a plurality of the second contact ends for electrically connecting to the bottom surface of the mounting board.

DETAIL DESCRIPTION OF THE INVENTION

Figure 1:
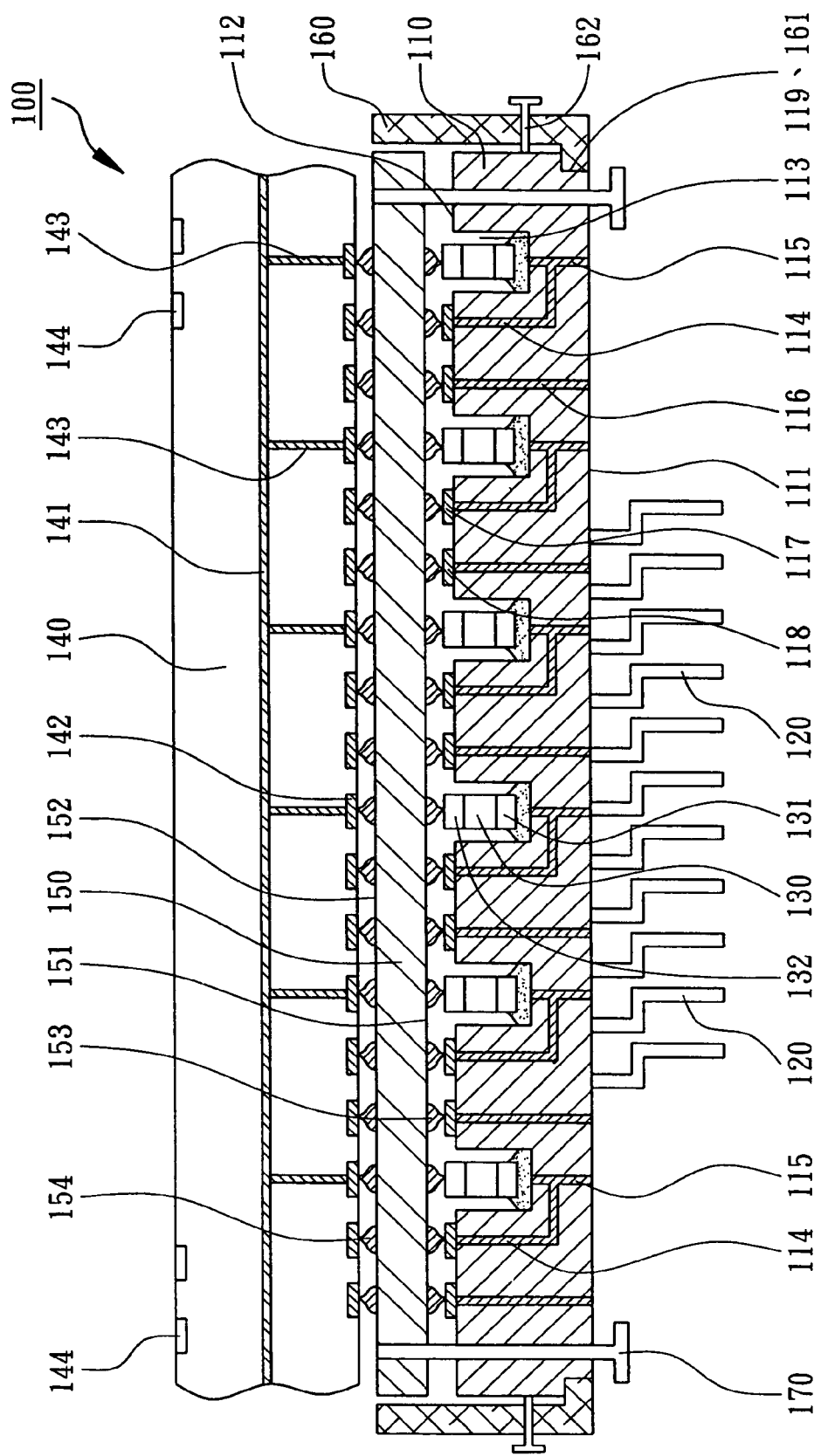
FIG. 1 is a cross-sectional view of the modularized probe head in accordance with the first embodiment of the present invention.

Please refer to the drawings attached, present invention will be described by means of an embodiment below.

According to the present invention, a modularized probe card 100 mainly comprises a probe head 110 with probes 120, a plurality of decoupling components 130, a mounting board 140 and an interposer 150. In this embodiment, the probe head 110 is a multi-layer ceramic substrate; however, it can be a glass substrate, a Si wafer, or a PCB according to the CTE of the devices under test. The probe head 110 has a probing surface 111 and a corresponding back surface 112. A plurality of cavities 113 are formed on the back surface 112, preferably, the cavities 113 are arranged in an array. The probe head 110 includes a plurality of power/ground circuitries 114, a plurality of bypass circuitries 115, and a plurality of signal circuitries 116. A plurality of power/ground pads 117 and a plurality of signal pads 118 are formed on the back surface 112 of the probe head 110. The power/ground circuitries 114 connect to the power/ground pads 117 and the corresponding power/ground probes 120. The bypass circuitries 115 connect to the corresponding power/ground circuitry 114. The length of the bypass circuitries 115 is shorter than the corresponding power/ground circuitries 114 so that the transmission length between the decoupling components 130 with the corresponding power/ground probes 120 is the shortest. In the present embodiment, the bypass circuitries 115 includes electrical vias so that the decoupling components 130 are vertical and electrically connected to the power/ground probes 120.

A plurality of probes 120 are deposed on the probing surface 111 of the probe head 110. In this embodiment, the probes 120 are flexible for probing the bonding pads, solder bumps, or solder balls on semiconductor devices under test. The probes 120 can be power/ground probes or signal probes to electrically connect to the power/ground circuitries 114 or signal circuitries 116. The decoupling components 130 can be bypass capacitors, decoupling capacitors or super-wide-band filters. Moreover, the decoupling components 130 are individual components which do not need to be embedded inside the probe head 110. Each decoupling component 130 has a first electrode 131 and a second electrode 132. When the decoupling components 130 are disposed in the cavities 113, the first electrode 131 is connected to the power/ground probes 120 via the bypass circuitries 115 and the power/ground circuitries 114. The second electrode 132 will expose from the back surface 112 of the probe head 110.

The mounting board 140 is configured to connect to the test head of a tester (not shown in the drawing). Normally, the mounting board 140 is a disk-shaped, multi-layer printed circuit board to carry the probe head 110 and the interposer 150. The mounting board 140 includes at least a ground plane 141, a plurality of bottom contact pads 142 on the bottom surface, and a plurality of top contact pads 144 on the top surface. At least one of the bottom contact pads 142 is connected to the ground plane 141 via internal circuitry 143. The interposer 150 is installed between the probe head 110 and the mounting board 140. In this embodiment, the interposer 150 is a ceramic substrate with internal circuitry (not shown in the figure) but it may be a glass substrate, a Si wafer, or a printed circuit board. The interposer 150 has a bottom surface 151 and a corresponding top surface 152 where the bottom surface 151 is aligned to the top surface 112 of the probe head 110 and the top surface 152 is aligned to part of the bottom surface of the mounting board 140 according to the pin assignment of the contact pads. Preferably, the dimension of the interposer 150 is the same as the probe head 110. A plurality the first contact ends 153 are formed by a plurality of stud bumps on the bottom surface 151 of the interposer 150. A plurality of the second contact ends 154 are formed by a plurality of stud bumps on the top surface 152 of the interposer 150. After the probe card assembly, the bottom surface 151 of the interposer 150 will electrically contact the back surface 112 of the probe head 110 where some of the first contact ends 153 will contact with the second electrodes 132 of the decoupling components 130 and the other first contact ends 153 will contact with the power/ground pads 117 and the signal pads 118 of the probe head 110. The second contact ends 154 will contact with the bottom contact pads 142 of the mounting board 140 so that the decoupling components 130 will electrically connect to the ground plane 141 of the mounting board 140 via some of the first contact ends 153 and some of the second contact ends 154 of the interposer 150, the bottom contact pads 142, the internal circuitry 143 of the mounting board 140. The other second contact ends 154 will connect the power/ground pads 117 and signal pads 118 to the outer contact pads 144 of the mounting board 140 through the other internal circuitry (not shown in the figure) inside the mounting board 140.

The modularized probe card 100 further comprises a probe head carrier 160 and a plurality of guide pins 170 where the probe head carrier 160 has an opening 161 which is aligned to and exposes the probing surface 111 of the probe head 110. The probe head carrier 160 is used to secure the probe head 110 with the interposer 150 on the mounting board 140. The guide pins 170 will penetrate through the through holes at the corners of the probe head 110 and the through holes at the corners of the interposer 150. Preferably, a plurality of downsets 119 are formed at the periphery on the probing surface of the probe head 110 for positioning the probe head carrier 160. The probe head carrier 160 includes a plurality of adjusting screws 162 for fine adjustment in X-Y direction of the probe head 110.

Therefore, the decoupling components 130 are deposed in the probe head 110 of the modularized probe card 100 and are protected by the interposer 150. The decoupling components 130 further electrically connect to the ground plane 141 of the mounting board 140 through the interposer 150 to eliminate the signal noise generated by the internal circuitry of the probe card 100. There is no need to embedded decoupling components inside the probe head 110 to reduce the manufacturing cost of the modularized probe head. Furthermore, once the decoupling components 130 are broken or malfunctioned, the probe head 110 and the interposer 150 can disassembly to replace the broken or malfunctioned decoupling components 130 and then reassembly again.

Figure 2:
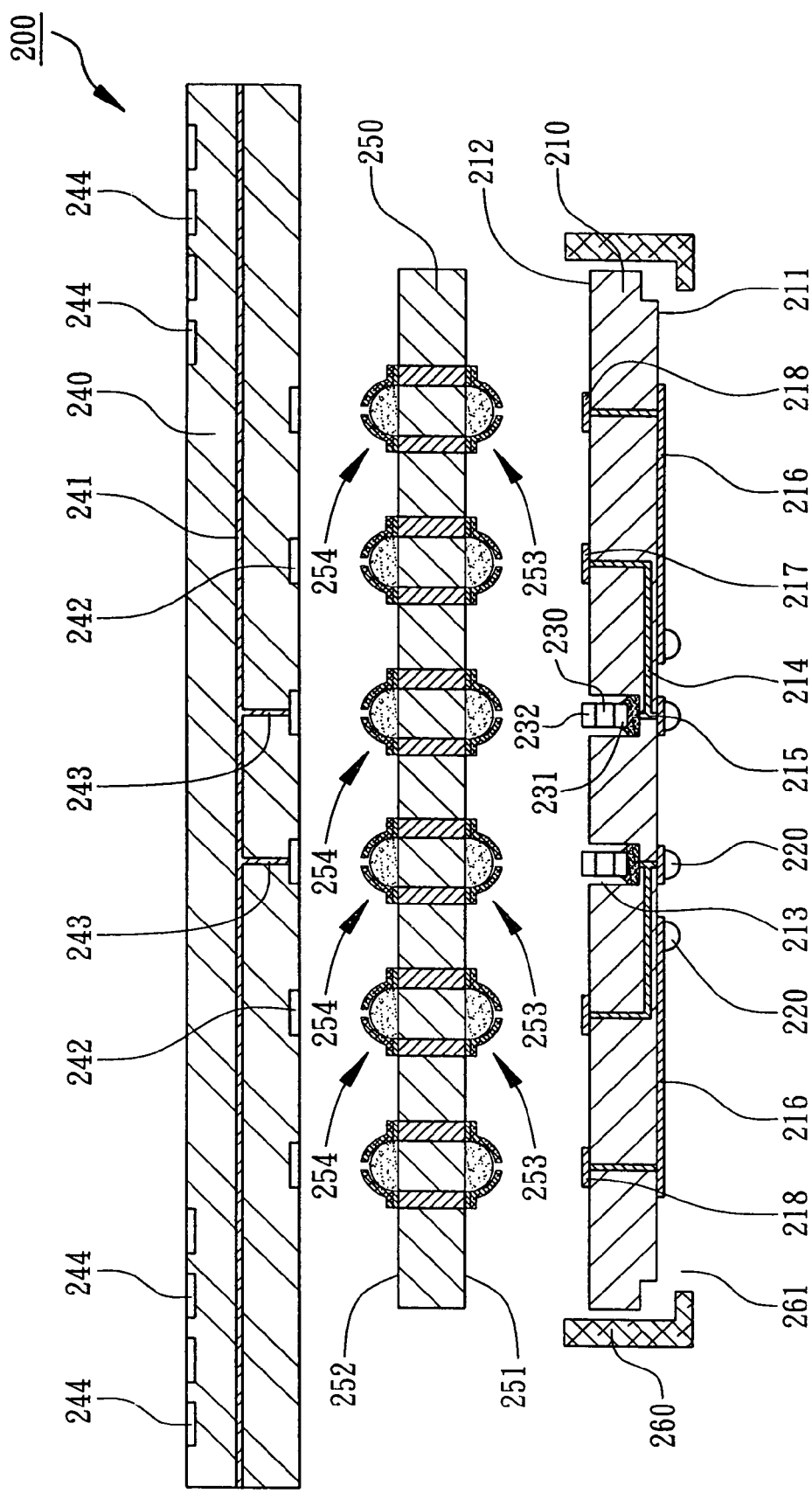
FIG. 2 is a cross-sectional view of the modularized probe head in accordance with the second embodiment of the present invention.

According to the second embodiment of the present invention, please refer to FIG. 2, a modularized probe card 200 mainly comprises a probe head 210, a plurality of decoupling components 230, a mounting board 240, and an interposer 250. The probe head 210 has a plurality of cavities 213 in the back surface 212 of the probe head 210. The probe head 210 further includes a plurality of power/ground circuitries 214, a plurality of bypass circuitries 215 and a plurality of signal circuitries 216. A plurality of power/ground contact pads 217 and a plurality of signal contact pads 218 are formed on the back surface 212 of the probe head 210. The power/ground circuitries 214 connect the power/ground contact pads 217 to the corresponding power/ground probes 220. The bypass circuitries 215 connect the corresponding power/ground circuitries 214 and the corresponding decoupling components 230 in the probe head 210. In the same way, the signal circuitries 216 connect to the signal contact pads 218 and the corresponding signal probes 220. Preferably, the length of the bypass circuitries 215 is shorter than the corresponding power/ground circuitries 214 so that the decoupling components 230 are closer to the corresponding power/ground probes 220.

The probes 220 are formed on the probing surface 212 of the probe head 210. In this embodiment, the probes 220 can be conductive bumps, or MEMS probes (Micro-Electrical-Mechanical System). The probes 220 include power/ground probes and signal probes which are respectively and electrically connected to the power/ground circuitries 214 and the signal circuitries 216 of the probe head 210. The decoupling components 230 are disposed in the cavities 213 on the back surface 212 of the probe head 210 where the decoupling components 230 are individual components. It is not required to embed the decoupling components 230 inside the probe head 210 as a single component. Each decoupling component 230 has a first electrode 231 and the second electrode 232. When the decoupling components 230 are installed in the cavities 213 in the back surface 212 of the probe head 210, the first electrodes 231 will connect to the power/ground probes 220 via the bypass circuitries 215 or the power/ground circuitries 214. The second electrodes 232 will expose from the back surface 212 of the probe head 210.

Figure 3:
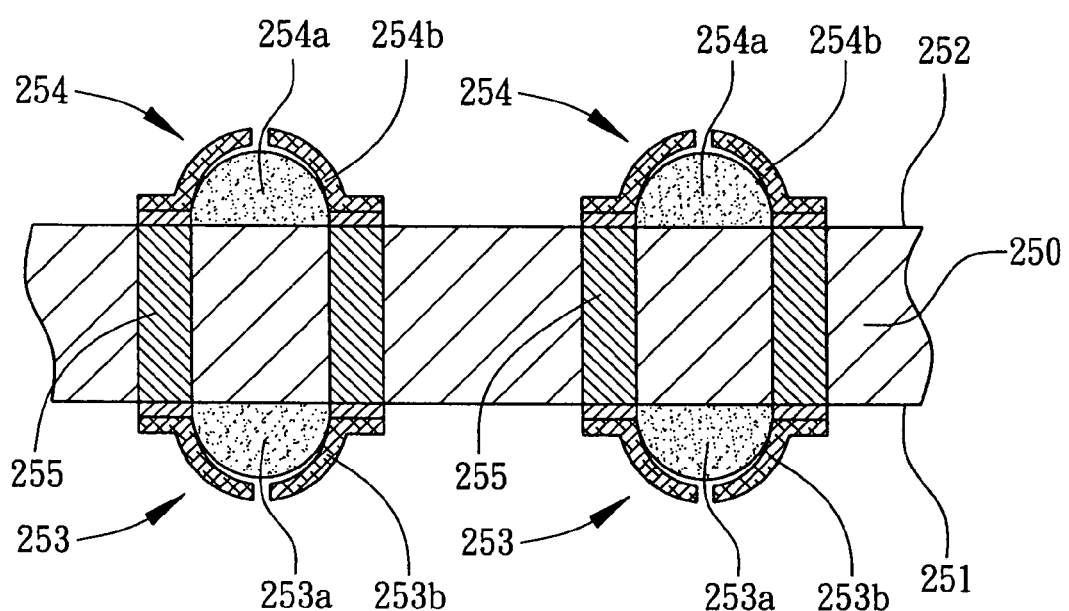
FIG. 3 is the cross-sectional view of the interposer of the modularized probe head in accordance with the second embodiment of the present invention.

Please refer to FIG. 2, the mounting board 230 is configured to mount onto the test head of a tester (not shown in the figure) and to carry the probe head 210 with the interposer 250. The mounting board 240 includes at least a ground plane 241, a plurality of bottom contact pads 242 on the bottom surface, and a plurality of top contact pads 244 on the top surface. Some of the bottom contact pads 242 are connected to the ground plane 241 via internal circuitries 243 of the mounting board 240. Referring to FIG. 3, the interposer 250 is installed between the probe head 210 and the mounting board 240. In this embodiment, the interposer 250 is a multi-layer ceramic substrate including electrical vias 255. The interposer 250 has a bottom surface 251 and a corresponding top surface 252. The bottom surface 251 of the interposer 250 is aligned to the back surface 212 of the probe head 210 and the top surface 252 is aligned to part of the bottom surface of the mounting board 240. A plurality of the first contact ends 253 are formed on the bottom surface 251 of the interposer 250, and a plurality of the second contact ends 254 are formed on the top surface 252 of the interposer 250. The first contact ends 253 and the second contact ends 254 are connected by the electrical vias 255. In the present embodiment, each of the first contact ends 253 includes a flexible dielectric bump 253a and at least a metal pin 253b around the flexible dielectric bump 253a. One ends of the metal pins 253b are bonded to the electrical vias 255. The other ends of the metal pins 253b are formed above the flexible dielectric bump 253a. In the same way, each of the second contact ends 254 includes a flexible dielectric bump 254a and at least a metal pin 254b around the flexible dielectric bump 254a. After assembling the probe card, the bottom surface 251 of the interposer 250 will be aligned with the back surface 212 of the probe head 210 where some of the first contact ends 253 can electrically contact the second electrodes 232 of the decoupling components 230, and the other contact ends 253 can electrically contact the power/ground contact pads 217 and signal contact pads 218. The second contact ends 254 are connected to the bottom contact pads 242 of the mounting board 240 such that the ground plane 241 of the mounting board 240 is electrically connected to the decoupling components 230 via the internal circuitries 243, the bottom contact pads 242 and the interposer 250. Also the second contact ends 254 will connect the power/ground contact pads 217 or signal contact pads 218 to the top contact pads 244 of the MOUNTING BOARD through the inner circuitry (not shown in the figure) inside the mounting board 240.

Furthermore, the modularized probe card 200 comprises a probe head carrier 260 which has an opening 261 to align and expose the probing surface 211 of the probe head 210. The probe head carrier is to secure the probe head 210 with the interposer 250 on the mounting board 240.

The above description of embodiments of this invention is intended to be illustrative and not limiting. Other embodiments of this invention will be obvious to those skilled in the art in view of the above disclosure.

What is claimed is:

1. A modularized probe card comprising:
   a probe head having a probing surface, a back surface and a plurality of cavities on the back surface;
   a plurality of probes fabricated on the probing surface of the probe head;
   a plurality of decoupling components installed in the cavities and electrically connected to the corresponding probes;
   a mounting board having multi-layer circuitries; and
   an interposer installed between the probe head and the mounting board, wherein the interposer has a plurality of the first contact ends on a bottom surface thereof, the bottom surface of the interposer is aligned to the back surface of the probe head such that the first contact ends electrically contact the corresponding decoupling components,
   wherein the first contact ends include flexible bumps, wherein each flexible bump includes a dielectric body and at least a metal pin around the dielectric body.

2. The modularize probe head according to claim 1, wherein one ends of the metal pins are bonded to electrical vias of the interposer, the other ends of the metal pins are formed above the flexible dielectric bumps.

* * * * *